United States Patent [19]

Sorensen et al.

[11] Patent Number: 4,504,529
[45] Date of Patent: Mar. 12, 1985

[54] XEROGRAPHIC METHOD FOR DRY SENSITIZATION AND ELECTROLESS COATING OF AN INSULATING SURFACE AND A POWDER FOR USE WITH THE METHOD

[75] Inventors: Gunnar Sorensen, Risskov; Leo G. Svendsen, Aarhus, both of Denmark

[73] Assignee: A/S Neselco, Copenhagen, Denmark

[21] Appl. No.: 389,934

[22] Filed: Jun. 18, 1982

Related U.S. Application Data

[63] Continuation of Ser. No. 224,530, Dec. 11, 1980, abandoned.

[30] Foreign Application Priority Data

Apr. 11, 1979 [DK] Denmark .............................. 1507/79

[51] Int. Cl.³ .......................... G03G 13/22; C23C 3/02
[52] U.S. Cl. ..................................... 427/437; 427/438; 430/16; 430/49; 430/31; 430/97; 430/110; 428/407
[58] Field of Search ................... 430/311, 104, 48, 16, 430/97, 49; 427/437, 438

[56] References Cited

U.S. PATENT DOCUMENTS

| | | |
|---|---|---|
| 2,910,351 | 10/1959 | Szpak et al. .............................. 41/43 |
| 2,939,804 | 7/1960 | Schossberger et al. ......... 430/109 X |
| 2,966,429 | 12/1960 | Darrel et al. .......................... 117/212 |
| 3,043,685 | 7/1962 | Rosenthal ....................... 430/122 X |
| 3,226,256 | 12/1965 | Schneble, Jr. et al. .......... 427/305 X |
| 3,231,374 | 1/1966 | Sciambi ................................. 430/49 |
| 3,350,202 | 10/1967 | Silver ..................................... 430/49 |
| 3,352,731 | 11/1967 | Schwertz et al. .................... 430/126 |
| 3,647,450 | 3/1972 | Callgaris et al. ....................... 430/16 |
| 3,745,045 | 7/1973 | Brenneman et al. .................. 427/98 |
| 3,880,689 | 4/1975 | Rolker et al. ..................... 430/39 X |
| 3,942,983 | 3/1976 | DiBlas et al. .......................... 430/16 |
| 4,042,730 | 8/1977 | Cohen .................................. 427/305 |
| 4,307,168 | 12/1981 | Lelental ................................ 430/97 |

OTHER PUBLICATIONS

"Physics in Industry", Conference Proceedings 1976, pp. 101-105: New Photoimaging Processes for Industrial Use—A Link Between Basic and Applied Research.

Primary Examiner—John D. Welsh
Attorney, Agent, or Firm—Oblon, Fisher, Spivak, McClelland & Maier

[57] ABSTRACT

Disclosed is a method for the xerographic, pattern-wise deposition of a dielectric powder that is sensitized with a metal compound to enable the electroless plating of a pattern formed by said powder.

12 Claims, No Drawings

XEROGRAPHIC METHOD FOR DRY SENSITIZATION AND ELECTROLESS COATING OF AN INSULATING SURFACE AND A POWDER FOR USE WITH THE METHOD

This is a continuation of application Ser. No. 224,530, filed Dec. 11, 1980, abandoned.

The invention relates to a method for dry, selective sensitization of the surface of an insulating substrate for electroless deposition of a metal, including transfer of a metal compound to the surface.

Within electronics, it has for a long time been desirable to be able to transfer conducting materials in an prescribed pattern (selectively) with good adherence to the surface of an insulating substrate. In particular because the prescribed pattern mentioned might have details that do not touch other parts on the pattern, electroless deposition has been used. For this can be used for example masking of those parts of the surface which should not be metallized or/and sensitization of the parts which should be metallized. It is a long know method to use aqueous sensitization solutions and lately (e.g., in Danish Patent No. 132 801) pure organic solutions are described. In the above patent, an extremely lucid exposition of the function of these solutions, together with advantages and disadvantages of aqueous and organic solvents, has been made.

The method, where aqueous solvents are used, is in brief the following:

(1) Immersing in a $Sn^{+2}$ solution (sensitizer), rinsing.
(2) Immersing in an activator solution (e.g., a Pd compound), rinsing.
(3) Immersing in a metallizing bath.

The method, where an organic solvent is used, is based upon direct transfer of, e.g., Pd ions to the surface of the substrate by evaporating the organic solvent, which might also have etched the surface of the substrate.

These methods have the disadvantage that the precision of the metallization is determined by the method used for transfer of the sensitized pattern. As an example can be mentioned serigraphy, where the resolution will be no better than the mesh gauge of the silk screen. Also confluency and diffluency before drying may occur. Another problem in connection with the above methods is that the adherence in practice does not appear to be very good—a problem which is well know from nonselective metallizing. The solutions of this problem are, for example, described in SE Patent No. 350 774 (rubbing-in together with slight grinding), GB Patent No. 1 324 653 (ion bombardment), DE AS 1 571 802 (deposition of a binding layer prior to atomization of metal particles).

Transfer of the pattern may also be carried out by a selective desensitization by ultraviolet light, as described in the Proceedings of the conference Physics in Industry 1976: "New Photoimaging Processes for Industrial Use—a Link between Basic and Applied Research", pp. 101-105.

Still another method for transfer of a conducting pattern to the surface of a substrate consists in electrostatic precipitation of a masking layer, which is a positive picture of the desired conductive pattern on an existing layer of Cu on the insulating substrate. According to U.S. Pat. Nos. 2,966,429 and 2,910,351, the layer is produced by confluency during the melting of an electrostatically transferred thin layer of a dielectric powder. After removal by etching of the non-masked Cu layer, the conducting pattern will be left. In the latter of the above patents, reference is made to a non-published U.S. patent application No. 472,622, which alledgedly describes a photo-electrostatic process involving the surface of the substrate to be covered by a photo-conducting, insulating layer (probably as know from the ZnO process also known as "Electrofax"), The same patent describes that a dielectric powder in an ensuing partial process for electroplating with silver may be mixed with an Ag compound which, after melting-in with the dielectric powder, is reduced to metallic Ag in a bath. In this way, the conducting pattern obtained in the first partial process is covered by Ag particles, which may then be electroplated with other materials. It should be borne in mind that this partial process implies the presence of a conducting layer—in the description Cu—under the transferred and by reduction created Ag particles.

The procedure described in the latter two U.S. patents is time consuming but provides good results when coarse details such as printed circuits with satisfactory adherence are produced. However, both procedures use stationary "pattern electrodes" for the transfer of the pattern, which makes it difficult to alter the conductive pattern. Actually, the transfer only consists in selectively to protect parts of a laminated layer of Cu against being etched away; hence the good adherence may be ascribed to the lamination process.

The purpose of the invention is to avoid the disadvantages mentioned above and to obtain a transfer of a pattern to a surface of an insulating substrate, which is more flexible (i.e., easy to alter) and which provides a better adherence and greater possibilities of obtaining finer details than do the hitherto known procedures.

This is obtained with the procedure of the invention, which is special in that the transfer is made by the use of a xerographic process for the transfer of a dielectric powder containing a metal compound, after which the transferred powder is exposed to a treatment which will secure the adherence to the surface.

In one aspect of the invention a powder is used in the procedure according to the invention. This powder consists of a thermoplastic plastic material with an $Sn^{+2}$ compound precipitated on the surface of each powder particle.

In another aspect of the invention a powder is used in the procedure according to the invention. This powder consists of a thermoplastic plastic material with an $Sn^{+2}$ compound distributed in each powder particle.

In still another aspect of the invention a powder is used in the procedure according to the invention. This powder has the property that, when in a molten state, it wets the surface to be sensitized.

In yet another aspect of the invention the treatment after the transfer of the powder according to the invention consists in treating the substrate and powder with an organic solvent to obtain adherence.

In a further aspect of the invention a procedure according to the invention is shown which will establish adherence between powder and substrate surface by melting of the substrate surface.

In an aspect of the invention a powder as used in the procedure according to the invention is disclosed. This powder contains an infrared-absorbing material.

In another aspect of the invention a powder is shown which is used in the procedure according to the invention, the essential component of this powder being a material with large loss-angle at microwave frequencies.

The invention will be further described in the following with specification of subprocesses and examples of preparations which have appeared to be particularly advantageous in connection with the reduction to practice of the invention.

What makes possible to utilize a procedure as specified in the present invention, and which has not been known hitherto, is that it still may be advantageous to use a three-step process as that described in the introduction, but that it is possible to avoid the wet process at the transfer of the $Sn^{+2}$ compound, the sensitizing part of the process, and the subsequent selective desensitizing. The adherence between the $Sn^{+2}$ compound and the surface of the substrate in the wet process is not overwhelmingly good, but quite surprisingly it has appeared that transfer performed according to the invention gives an adherence, which is extremely good, i.e., that the Pd and Cu atoms transferred in the following subprocesses have a better fixation to the substrate than it has been possible to obtain so far.

The xerographic process has appeared to be well-suited for transfer of the sensitizing $Sn^{+2}$ compound as it provides both a suitable coverage of the insulating substrate and a suitable resolution, which are normally conflicting claims. Furthermore, many of the plastic qualities used for toning powders in xerographic copying machines are well suited as regards adhesion to a large number of different substrate materials. As the example, reference is made to those mentioned in U.S. Pat. No. 2,966,429; furthermore, it will be a simple matter for the man skilled in the art to check the usability of commercially available plastic materials. Good results are obtained with such different materials as polyacrylates, polyamides, polyvinylclorides, and phenol resin. As usable substrate materials may be mentioned polyesters, polyacrylates, polyvinylchlorides, polycarbonates, i.e., a great deal of the materials used in practical electronics.

The fixation to the surface of the insulating substrate can partly be obtained by methods, which by and large are well known, by powders not containing sensitizing metal compounds, typically by "burning down". This means that each particle of the powder is heated so that when melting, it spreads on the surface to a degree which depends on the wetting (the surface tension). According to the invention, the same demands are not made to a pore-free confluencing that are made in the procedures that are based on using the layer obtained as a mask prior to etching. This is probably connected with the sensitizing mechanism which, rather than demanding an even surface as a basis for the subsequent electroless metal deposition, uses the metal-compound particles deposited on the surface as a seed. This means that the demands on the adherence are greater than the demands on the spreading.

With a view to obtaining a local heating of the transferred particles, materials have been added to them which absorb the energy radiation, the wavelength of which depends on the application and combination of substrate/powder. In cases where the powder material is not thermoplastic, it will be expedient to let each powder particle heat the surface of the substrate in this area of contact, and a suitable choice of softening temperature for the substrate will make possible a melting-down in this case. This method is just a special case of the method that consists in heating all of the surface to the melting point.

In circumstances where heating is not desirable, fixation can be made by letting the powder on the substrate pass an atmosphere with a suitable vapor pressure of an organic solvent which, in the well-known way, makes the substrate and particles stick to one another, and subsequently evaporate the solvent.

There are several ways of producing the prepared powders used according to the invention. The methods used so far at the development of the method have all had the purpose of securing that each powder particle, at least on its surface, has had a reasonably even distribution of $Sn^{+2}$ compounds. This can be obtained in two principally different ways: —either directly by impregnating the surface of each particle, or by producing a solid mass aiming at an even distribution of the sensitizing compound in the plastic material which is subsequently pulverized in the usual way to obtain a suitable size of the particles. This size is determined by the construction of the xerographic transfer apparatus and is a well-known technique within the subject in question.

EXAMPLE 1

Production of a sensitizing powder, aiming at an even distribution of tin compounds in the material:

Add to 10 g of a plastic material 0.05—0.5 g of $SnCl_2$, $2H_2O$. This mixture can be wet- or dry-ground in an aqueous or organic liquid. Then the liquid may be removed by a conventional drying technique, e.g. evaporation, filtration, or spray-drying.

Impregnation of the individual plastic particles with a tin compound may, according to the invention, use as its starting point already existing powders, but may also be done at the production of the plastic powder.

A more appropriate way of obtaining the desired distribution of tin in the individual plastic particle is to do it during the production of the powder. This can, for example, be achieved by atomizer-drying (spray-drying) the plastic-containing solution, which also contains a tin compound.

As certain $Sn^{+2}$ compounds, e.g. $SnCl_2$, $2H_2O$ are soluble in organic solvents, it is possible to influence the powder individually by a solvent, which makes the particles swell and hence absorb the tin compounds which are dissolved in the organic solvent. Evaporation of the solvent creates the desired distribution of $SnCl_2$, $2H_2O$.

EXAMPLE 2

A plastic powder, which swells when an organic solvent is used, is suspended in such a solvent, to which is added a saturated solution of $SnCl_2$, $2H_2O$ in methanol without precipitation of tin compounds. After a certain time of reaction, the solvent can be removed by e.g. filtering or spray-drying of the suspension, which now contains the prepared powder. The quantity of tin to be added depends very much on the combination of plastic material and solvent and their relative volumes and also on the method of drying the powder. In so far as the plastic material can be completely dissolved in an organic solvent, a tin compound, also in an organic solvent, may be added. Then the prepared powder can be obtained by a conventional process of drying, e.g. by spray-drying of the plastic-containing solution.

Another method, which has been successfully used, is a chemical precipitation of an $Sn^{+2}$ compound on the powder particles during continuous stirring.

EXAMPLE 3

Precipitation of a tin compound on each plastic particle. 10 g plastic powder is suspended in 200 ml methanol. While stirring, a saturated solution of $SnCl_2, 2H_2O$ in methanol is added, the quantity depending on the size of the powder particles. The weight of the $SnCl_2, 2H_2O$ may be e.g. 1–10% of that of the plastic powder. While stirring, an alkali agent is added, causing the suspended plastic powder to act as a scavenger for the precipitation of hydroxy-tin-chlorides. The powder prepared in this way can then be dried, and if necessary ground and sieved.

Through the development of the method according to the invention, sensitization of an insulating surface has been obtained with a view to a subsequent electroless metallization, performed by known methods, without demanding preceding special masters or masks, as any pattern which can be copied by a xerographic process, can be transferred to the desired substrate surface. The method does not put heavy demands on ressources nor is it detrimental to environment, as an etching-off of the superfluous metal layer is avoided. Furthermore, the metal layer transferred by electroless metallization has a much better adherence to the surface of the substrate (e.g. as measured by the Scotch-Tape method) than layers of the same thickness, which have been transferred by conventional electroless deposition or by evaporation or vpd-methods (vpd: vapour-phase deposition). In addition, the present method makes much less demands on the cleaning of the surface of the substrate prior to metallization than do the methods mentioned above.

We claim:

1. A method for the dry, selective sensitization of the surface of an insulating substrate and subsequent electroless deposition of a metal, comprising:
   xerographically depositing a dielectric powder containing a metal compound on an insulator substrate in a desired pattern;
   fixing said deposited powder on the surface of said substrate; and
   electrolessly depositing a conductive metal from solution onto the pattern defined by said xerographically deposited powder.

2. The method of claim 1, wherein the main constituent of said dielectric powder is a thermoplastic material, said powder comprising:
   a $Sn^{+2}$ compound precipitated on the surface of each thermoplastic powder particle.

3. The method of claim 1, wherein the main constituent of said dielectric powder is a thermoplastic material, said powder comprising:
   a $Sn^{+2}$ compound distributed thoughout each powder particle.

4. The method of claim 2 or 3, wherein the surface of the insulator substrate to be sensitized is wetted by said plastic material when molten.

5. The method of claim 1, wherein said insulator substrate is treated with an organic solvent which promotes the adhesion between the dielectric powder applied to the substrate and the surface of the substrate.

6. The method of claim 1, wherein the adhesion between applied powder particles and the surface of the insulator substrate is achieved by local melting of said powder particles.

7. The method of claim 1, 2, 3, 5 or 6, wherein said powder particles contain an infrared-absorbing material.

8. The method of claim 1, 2, 3, 5 or 6, wherein said powder particles comprise as their main constituent a material having a large loss angle at microwave frequencies.

9. A dielectric powder, comprising:
   particles of a thermoplastic material containing a $Sn^{+2}$ compound precipitated on the surfaces of the particles.

10. A dielectric powder, comprising:
    particles of a thermoplastic material containing a $Sn^{+2}$ compound distributed throughout each particle.

11. A method for the dry, selective sensitization of the surface of an insulating substrate and subsequent electroless deposition of a metal, comprising:
    xerographically depositing a dielectric powder containing an ionic stannous compound on an insulator substrate in a desired pattern;
    fixing said deposited powder on the surface of said substrate; and
    electrolessly depositing a conductive metal from solution onto the pattern defined by said xerographically deposited powder.

12. A method for the dry, selective sensitization of the surface of an insulating substrate and subsequent electroless deposition of a metal comprising:
    xerographically depositing a dielectric powder containing a metal compound as the sensitizing species for said subsequent electroless deposition on an insulator substrate in a desired pattern;
    fixing said deposited powder on the surface of said substrate by a method which does not hinder the sensitizing function of said metal compound in said subsequent electroless deposition step; and
    electrolessly depositing a conductive metal from solution onto the pattern defined by said xerographically deposited powder.

* * * * *